US012763299B2

(12) United States Patent
Saghayezhian et al.

(10) Patent No.: US 12,763,299 B2
(45) Date of Patent: Oct. 13, 2026

(54) PLASMA VESSEL CLEANING FOR ION BEAM SYSTEM

(71) Applicant: VEECO INSTRUMENTS INC., Plainview, NY (US)

(72) Inventors: Mohammad Saghayezhian, Plainview, NY (US); Binyamin Rubin, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 118 days.

(21) Appl. No.: 18/786,227

(22) Filed: Jul. 26, 2024

(65) Prior Publication Data

US 2025/0046586 A1 Feb. 6, 2025

Related U.S. Application Data

(60) Provisional application No. 63/516,608, filed on Jul. 31, 2023.

(51) Int. Cl.
*H01J 37/32* (2006.01)

(52) U.S. Cl.
CPC .. *H01J 37/32862* (2013.01); *H01J 37/32449* (2013.01); *H01J 37/32082* (2013.01); *H01J 2237/335* (2013.01)

(58) Field of Classification Search
None
See application file for complete search history.

(56) References Cited

U.S. PATENT DOCUMENTS

| | | | | |
|---|---|---|---|---|
| 6,136,211 | A | 10/2000 | Qian et al. | |
| 6,872,322 | B1 * | 3/2005 | Chow | H01L 21/32137 216/75 |
| 10,658,161 | B2 | 5/2020 | Wang et al. | |
| 2006/0264060 | A1 | 11/2006 | Ramaswamy et al. | |
| 2011/0108058 | A1 | 5/2011 | Srivastava et al. | |
| 2020/0126757 | A1 | 4/2020 | Anglin et al. | |

FOREIGN PATENT DOCUMENTS

| | | | |
|---|---|---|---|
| JP | 2014110136 | A * | 6/2014 |
| KR | 20020070255 | A | 9/2002 |
| KR | 20120098774 | A | 9/2012 |
| KR | 20130121829 | A | 11/2013 |

OTHER PUBLICATIONS

Machine translation: JP2014110136; Yamamoto et al. (Year: 2014).*

* cited by examiner

*Primary Examiner* — Natasha N Campbell
(74) *Attorney, Agent, or Firm* — HOLZER PATEL DRENNAN

(57) ABSTRACT

An in situ cleaning of the vessel of an ion deposition/etching system that includes utilizing the E-mode of the system and increasing plasma potential to remove material deposited on the vessel walls. The method includes operating the system with plasma only, no grid bias, minimal gas flow and high RF power level. During this cleaning mode, radially moving capacitively coupled ions impinge on the vessel inner wall, etching undesired back scattered material from the wall.

19 Claims, 3 Drawing Sheets

PLASMA VESSEL CLEANING FOR ION BEAM SYSTEM

CROSS-REFERENCE

This application claims priority to U.S. provisional application Ser. No. 63/516,608 filed Jul. 31, 2023, the entire disclosure of which is incorporated herein by reference for all purposes.

BACKGROUND

In plasma ion beam applications (either or both ion beam deposition and ion beam etching), stable and consistent performance of the ion beam source is always desired. There are several factors that directly affect the performance and stability of the ion beam system and the ion source, such as plasma density, efficiency of RF power delivery, gas distribution uniformity, grid optics, etc. Of these, the efficiency of RF power delivery particularly affects the long term performance of the system and process. More efficient RF power delivery is obtained when the plasma vessel (also referred to as discharge chamber) is "clean," having little to no conductive coating on the vessel inner walls. However, during deposition and etch applications, some of the sputtered materials inevitably scatter towards the ion source and deposit onto the inner walls of the plasma vessel; hence, long term use of the ion beam system always sees a build-up of material on the vessel walls. Excessive material deposition, conductive or dielectric, can result in flaking, which in turn might lead to contaminating particle generation, which is a major issue in wafer processing.

In the following, described is a method to restore the plasma vessel to avoid the aforementioned problems.

SUMMARY

The present disclosure is directed to in situ cleaning of the vessel of an ion deposition/etching system that includes accelerating ions towards the vessel walls, to remove material deposited on the walls. The methods of this disclosure can be applied to any gridded or non-gridded ion source systems, including those with an assist ion beam.

During the use of ion systems or sources, a considerable amount of sputtered material is typically back scattered (or back sputtered) onto the inner walls of the plasma vessel, resulting in eventual reduced radio frequency (RF) power delivery and process drift, requiring time to retune the system, the process, and eventually requiring ex situ cleaning. A coated vessel decreases the system uptime and operation potential, and ultimately increases the cost of ownership of the system. With the cleaning methods described herein, system downtime is decreased, productivity is increased and operation cost is reduced. The methods can be done during or in between substrate processing.

The methods include having plasma in the plasma vessel, no beam extraction, minimal gas flow and high RF power level.

The disclosure describes, in one particular embodiment, a method of in situ cleaning a vessel of an ion beam system. The method includes, via the ion beam system, providing an initial RF power and a low gas flow sufficient to maintain a plasma, turning off any grid bias, and, depending on plasma vessel size, increasing the RF power to the plasma to at least 500 W, e.g., 500 W-3000 W.

The disclosure also describes a method of in situ cleaning a vessel of an ion beam system by transitioning the system from an H-mode to an E-mode, turning off any grid bias, increasing plasma potential after turning off any grids bias, increasing RF power, and impinging energized ions on an inner wall of the vessel.

Also described is a method of in situ cleaning of a vessel of an ion beam system, the method impinging capacitively coupled ions onto a coating on an inner wall of the vessel.

This Summary is provided to introduce a selection of concepts in a simplified form that are further described below in the Detailed Description. This Summary is not intended to identify key or essential features of the claimed subject matter, nor is it intended to be used to limit the scope of the claimed subject matter. These and various other features and advantages will be apparent from a reading of the following Detailed Description.

DETAILED DESCRIPTION

Figure 1:
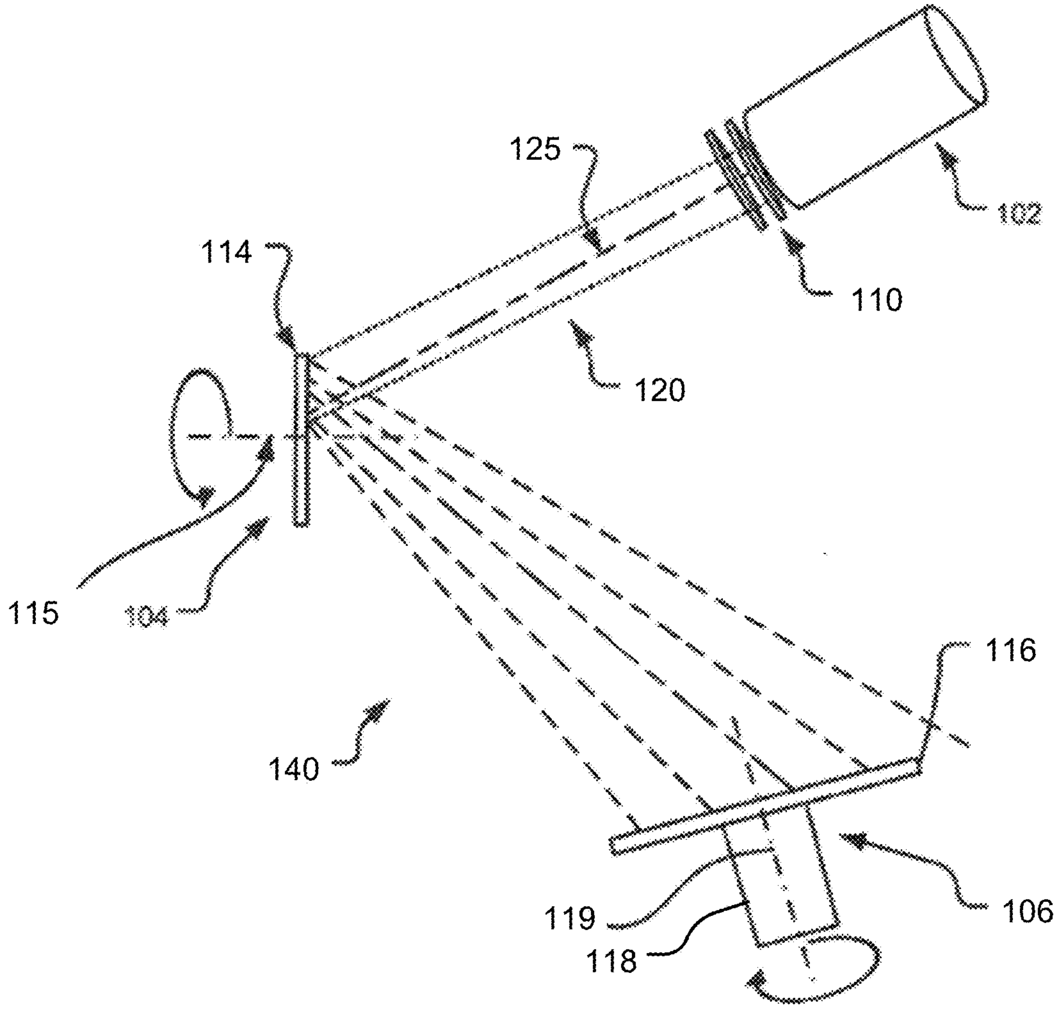
FIG. 1 is a schematic side view of a portion of an ion beam deposition system.

RF power delivery is an important factor in performance and stability of ion systems, as well as other factors such as plasma density, gas distribution uniformity, grid optics, etc. These factors affect process stability, time between maintenance, plasma vessel temperature and plasma density, which in turn affects ion beam divergence. In etching or deposition applications, a portion of the sputtered target material scatters backwards to the plasma vessel and deposits on the inner walls of the vessel. In the cases of metal etching or deposition, the back scattered metal material forms a thin conductive layer on the plasma vessel inner walls. This metal layer absorbs and reflects RF power via eddy currents. Because of this, the effective RF power delivered to the plasma is reduced. Attempts have been made to reduce the effects of eddy currents, such as by using slotted deposition shields. However, these methods, although they might be somewhat effective in prolonging the life of the plasma vessel, do not completely eliminate the coating accumulation on the vessel walls and its effect on RF power delivery. The following disclosure describes in situ processes for cleaning the plasma vessel, thus restoring efficient RF power delivery and stabilizing the overall ion beam process.

Typically, when using inductively coupled plasma, it is desired to operate in H-mode (also referred to as inductively coupled or transformer coupled plasma), where plasma density is high, RF coupling is efficient and electron temperature is relatively low. Under such conditions, the plasma potential (sheath potential) remains low and ions moving through the near-wall sheath towards the vessel walls have low energy, which is below the sputtering threshold. As described further below, when the neutral gas pressure is reduced, an increase in electron temperature can occur, in turn increasing the plasma potential. This increased plasma potential may provide enough energy to ions moving towards the inner walls of the plasma vessel to cause significant sputtering at the walls, thus removing material present on the vessel walls. An increase of RF power increases the decay length of the RF electromagnetic field as well, which leads to partial transition to E-mode (also referred to as capacitively coupled plasma). In this E-mode, the electric component of the RF electromagnetic field increases the energy of the ions moving towards the walls, which can further increase the material removal rate.

In the methods described herein to clean the vessel, the source is operated in plasma only mode, where there is no ion extraction, although it is possible to perform the cleaning during ion extraction. Additionally, the gas flow is lowered to a minimum value while sustaining the plasma. The cleaning time is adjusted depending on the physical transparency of the grid, the coating thickness and pumping speed of the chamber.

Conventionally, vessels are made of dielectric materials and are cleaned ex situ by interrupting the operation of the system and breaking the vacuum of the ion beam system; this leads to increased cost of ownership due to lost process time and maintenance cost. As no breaking of the system vacuum is required in the methods described herein, operation downtime of the system is reduced. The in situ cleaning can be done between substrate processing, e.g., when determined that the layer of metal on the vessel walls has grown to an undesirable thickness, e.g., based on the loss of RF power efficiency or process drift. Additionally, periodic in situ cleaning, per these methods, can not only considerably prolong the average time between more extensive system maintenance, but can inhibit unplanned system shut down resulting from process instability or contamination. By vessel cleaning, at regular intervals, the ambiguity in determining a best time for performing maintenance is removed, as the thickness of the deposited material can be controlled and maintained below a desired level.

The methods of this disclosure can be applied to any gridded or non-gridded ion or plasma source, including those with an assist ion beam. The methods are suitable for ion systems or sources that operate at any pressure, power, and/or sputtering rate. FIG. 1 shows a generic ion beam system to which the methods of this disclosure are applicable.

In the following description, reference is made to the accompanying drawing that forms a part hereof and in which is shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below. In some instances, a reference numeral may have an associated sub-label consisting of a lower-case letter to denote one of multiple similar components. When reference is made to a reference numeral without specification of a sub-label, the reference is intended to refer to all such multiple similar components.

FIG. 1 illustrates a generic diagram of an ion beam system 100. Even though the implementation of the ion beam system 100 is shown as an ion beam sputter deposition system, components of the ion beam system 100 may also be used with some alteration for implementing any or all of an ion beam etch system, an ion implantation system, an ion beam deposition system, an ion beam assisted deposition system, etc. The system 100 can be used to, e.g., deposit, deposit and modify, and/or deposit and etch material.

The ion beam system 100 includes an ion beam source 102, a target assembly 104, and a substrate assembly 106 for supporting a substrate 116. Note that the substrate assembly 106 may include a single large substrate 116 or a sub-assembly holder that holds multiple smaller individual substrates 116. The substrate 116 may be formed of, for example, one or more layers of silicide(s), nitride(s), oxide (s), metal(s) including alloys, or ceramic(s).

The ion beam source 102, which includes a dielectric vessel, generates an ion beam 120 that includes a plurality of ion beamlets targeted or directed toward the target assembly 104, which includes at least one target 114 affixed to the target assembly 104 that includes a material desired to be deposited on the substrate 116. The ion beam 120 has a centerline axis 125 that is targeted or directed toward the target assembly 104 such that the ion beam 120 completely or near completely impinges on the target assembly 104. The target assembly 104 is located on a platform that, if needed, can rotate the target assembly 104 about a given axis 115. In some designs, the target assembly 104 may tilt. The ion beam 120, upon striking the target assembly 104, generates a sputter plume 140 of material from the target 114.

Examples of material for the target 114 include, without limitation, metals such as titanium (Ti), tungsten (W), molybdenum (Mo), tantalum (Ta), ruthenium (Ru), cobalt (Co), copper (Cu), and rhodium (Rh), dielectric and semiconductor materials such as, but not limited to, nitrides of metals and semiconductors such as titanium nitride (TiN), tantalum nitride, (TaN) silicon nitride ($Si_3N_4$), molybdenum nitride (MoN), tungsten nitride (WN, $W_2N$, $WN_2$), oxides of metals and semiconductors such as silicon oxide ($SiO_2$), titanium oxide (TiO), aluminum oxide ($Al_2O_3$), silicides of metals and semiconductors such as tungsten silicide ($W_5Si_3$), molybdenum silicide ($MoSi_2$), titanium silicide ($Ti_5Si_3$), and other types of metal, dielectric, and semiconductor targets.

The ion beam 120 strikes the target 114 at such an angle so that the sputter plume 140 generated from the target 114 travels towards the substrate assembly 106 and the substrate 116. In some configurations of the ion beam system 100, the sputter plume 140 is divergent as it travels from the target 114 towards the substrate assembly 106 and may partially overspray the substrate 116. However, in other configurations, the sputter plume 140 may be made more or less concentrated so that its resulting deposition of material is more effectively distributed over a particular area of the substrate 116.

The substrate assembly 106 is located such that the sputter plume 140 strikes the substrate 116 at a desired angle as well. In one example configuration of the ion beam system 100, the substrate assembly 106 is attached to a fixture 118 that allows the substrate assembly 106 to be moved in a desired manner, including rotation of the substrate assembly 106 about its axis 119 or pivoting the fixture 118 to tilt the substrate assembly 106 to alter its angle with respect to the sputter plume 140.

In one example of the ion beam system 100, the ion source 102 generates ions that are positively charged. However, in an alternate example, the ion source 102 generates ions that are negatively charged. The ion source 102 is a radio frequency (RF) type or a microwave type gridded ion source.

The system 100 may include one or more grids 110 proximate the ion beam source 102 for directing the ion beam 120 from the ion beam source 102 to the target assembly 104. In one configuration of the ion beam system 100, the grids 110 steer the ion beamlets such that the ion beam 120 is divergent from the centerline axis 125 of the ion source 102, compared to if no bulk ion beam steering was provided. In an alternate configuration, the grids 110 steer the ion beamlets such that the ion beam 120 is not divergent from the centerline axis 125. Other constructions and configurations may also be provided. The grids 110 can cause the ion beam 120 to have a symmetric or asymmetric cross-sectional profile around a beam axis.

The grids 110 have holes or apertures therethrough to allow the beamlets of the ion beam 120 to pass through the grids 110. The individual holes in the grids 110 may be positioned to yield the highest density of holes per area to maximize ions extracted from the ion source 102. The grids 110 may have a rectilinearly or elliptically or asymmetrically shaped pattern of holes. The number and size of the holes that affects the transparency of the grids 110.

As indicated above, the system 100 shown is a generic and generalized system. The system 100 may include any additional features, such as a reactive gas source, an assist ion source, an assist gas source, various heaters, neutralizers, turrets for multiple rotational targets, and diagnostic probes and sensors.

The system 100 may operate at any conventional operating parameters under any operating conditions. For example, the system 100 may be under inert atmosphere, may have a reactive gas added and/or a noble gas. For example, introduction of gases may be as low as 1 sccm to as high as 100 sccm. The system 100 typically operates at a process (chamber) pressure of less than $10^{-3}$ torr, e.g., $1\times10^{-5}$ to $1\times10^{-3}$ torr. The system 100, particularly the ion source 102, can utilize a high energy ion beam, e.g., having a voltage ranging from 40 V to 2000 V. The system can provide a net deposition rate greater than 10 angstroms/minute, sometimes greater than 200 angstroms/minute.

After extended use of the system 100, material from the at least one target 114 and/or the substrate 116 is back scattered and deposited on the grids 110 and inside the ion beam source 102. The amount of back scattered material deposited inside the ion beam source is typically more the more transparent the grid(s) 110 are. Although not shown in FIG. 1, the ion beam source 102 includes a plasma vessel where neutral gas is injected and ionized; the back scattered material deposits on the vessel inner walls. If the back scattered material is a metal, a thin conductive layer is formed on the vessel walls. As described above, this metal layer is undesirable as it absorbs and reflects RF power reducing the efficiency and stability of the system 100.

To remove the undesired material, in an in situ method, the system 100 is transitioned from the typical operating, inductively coupled H-mode to the capacitively coupled E-mode with relatively high plasma potential. In E-mode, the ions from the ion source 102 couple to the high frequency electric field rather than to the high frequency magnetic field and hence are accelerated radially. This radial movement facilitates impingement of the ions on the vessel walls. Additional discussion regarding impingement of the ions on the coated vessel walls is below with regarding to FIG. 3.

Typically, during deposition and etching operations, the plasma is inductively coupled, also referred to as magnetically coupled, or, operating in the H-mode. During H-mode, ideally, the plasma density is high, RF coupling is efficient, and electron temperature is relatively low; the floating potential (sheath potential) remains low as well. Under these process conditions, back scatter occurs as does accumulation on the vessel walls, albeit at a low rate. However, under certain conditions, such as when the neutral pressure is low and the RF power is high, the plasma potential is higher, accelerating ions moving through the near-wall sheath toward the walls to energies higher than the sputtering threshold, causing significant back scattering on the vessel wall. Both slow accumulation and fast accumulation on the vessel walls will eventually result in an undesirable decrease of RF power. When a decrease of about 5% or 10% from the desired RF power is observed, it is beneficial to clean the vessel wall of this material.

To remove the material from the vessel wall, the system is transitioned to produce capacitively coupled plasma, or, to E-mode with high plasma potential. By lowering the gas flow and increasing the input RF power relative to H-mode, the plasma potential increases as well as the decay length of RF electromagnetic field, thus transitioning to E-mode.

During this E-mode cleaning process according to this disclosure, the source is operated in plasma only mode, where there is no ion extraction; the RF power is high (e.g., at least 500 W) and the gas flow is lowered to a minimum value where the plasma remains sustained (e.g., no more than 30 sccm, e.g., about 2-30 sccm). The exact value of gas flow rate depends on the plasma vessel size, transparency of the grids 110, and the gas pumping capability of the chamber. Ions from the source impinge on the vessel walls, etching the deposited metal layer from the vessel walls. It is noted that it is desired to etch only the back scattered (e.g., metal) coating off the plasma vessel and not etch the dielectric wall itself. Over etching will result in deposition of the dielectric material etched from the plasma vessel onto the upstream side of the grids 110, which may lead to arcing and source instabilities. Deposition of etched metal material on to the grids 110, however, should have no detrimental effect.

The cleaning time of the vessel is adjusted depending on the physical transparency of the grid(s) 110, the thickness of the back scattered material on the vessel walls, the gas pumping capability of the chamber, the plasma vessel size, and also the amount of material to be removed. The time for the cleaning, when the RF power is high (e.g., at least 500 W, e.g., 500 W-3000 W) and the gas flow is low (e.g., no more than 30 sccm, e.g., 2-30 sccm), is at least 30 seconds, or at least 60 seconds or 1 minute, or at least 2 minutes, and in some embodiments, about 2 hours; this time does not include any ramp-up time. Typically, the cleaning takes no longer than 4 hours, in some embodiments no longer than 2 hours.

Figure 2:
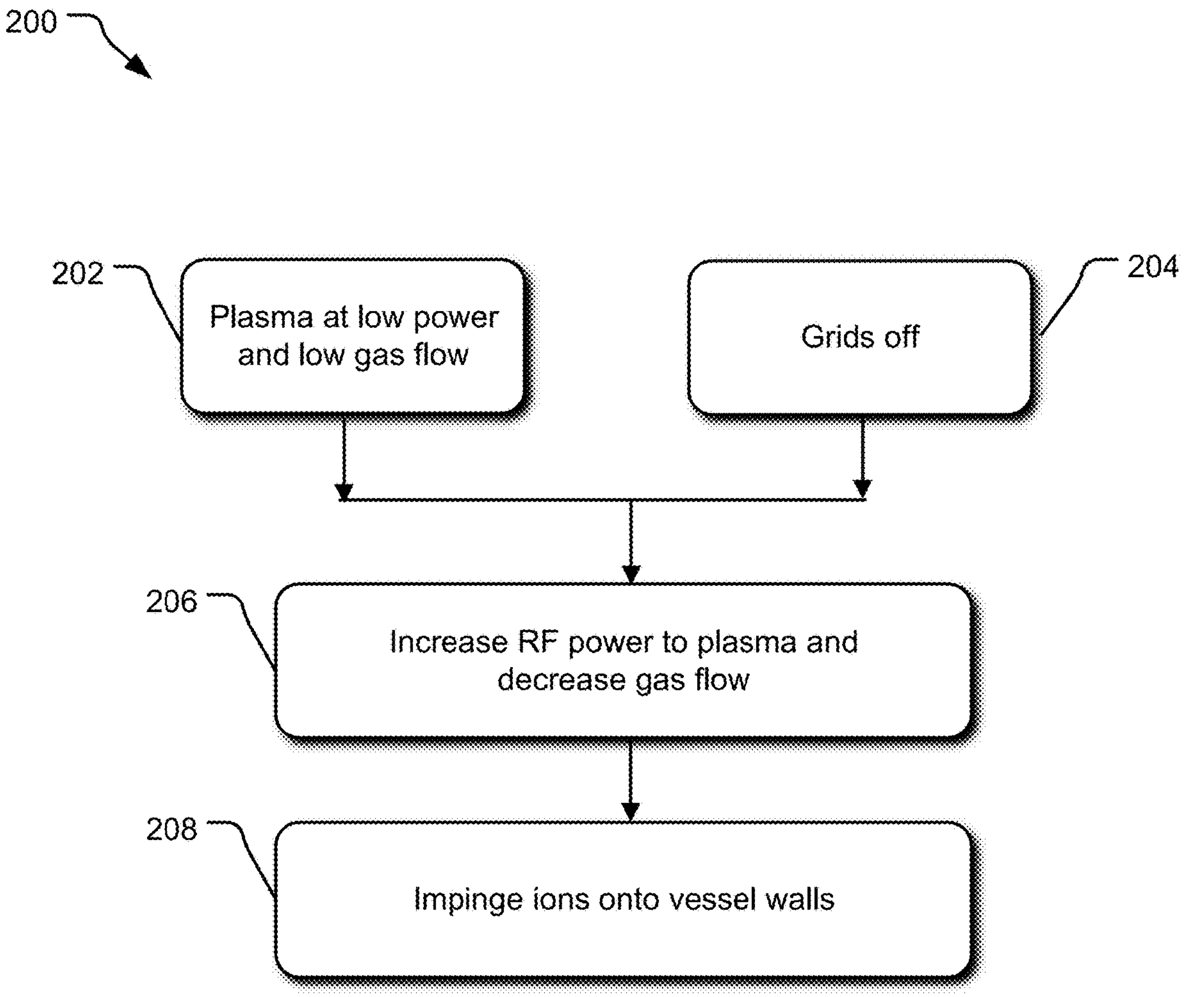
FIG. 2 is a flowchart of a stepwise example method for cleaning a vessel in an ion beam system.

FIG. 2 shows a general in situ method 200 for cleaning the vessel in an ion beam system. In a first step 202, ignited plasma is maintained at low power and at low gas flow; this may be done by reducing the power and the gas flow from a previously higher level or by turning on the system with initially low power and gas flow. Examples of suitable power and gas flow are no more than about 500 W, such as 150 W-500 W, and about 10-60 sccm, respectively, depending on the vessel size. In a second step 204, which may be before, after, or simultaneous with the step 202, any grid bias is turned off.

In a third step 206, the RF power to the plasma is increased; for example, above 500 W, or e.g., above 1000 W, or, 500 W-3000 W. Other examples of high RF power are at least 1500 W and at least 2000 W. Also in step 206, the gas flow is decreased, depending on the initial gas flow, to no more than 30 sccm, such as 2-30 sccm. The power and gas flow are selected depending on the particular parameters of the system, including the properties (e.g., thickness) of the material on the vessel walls, the chamber properties, the vessel construction (e.g., size, material, dimensions, etc.), the gas species, the downstream grid(s), the particular plasma source, etc.

In a step 208, ions from the plasma impinge on the vessel walls, removing material (e.g., metal material) therefrom.

The cleaning process is operated for a time period, usually at least 30 seconds and no more than 4 hours, in some embodiments no more than 2 hours; the time period is based on the rate of removal of the material, which is dependent on the rate of ion impingement onto the vessel wall and the amount of material to be removed.

The method 200 can be done between substrate processing, e.g., when it has been determined that the layer of metal on the vessel wall has grown to an undesirable thickness, e.g., based on the decrease of RF power over time, or at scheduled intervals.

As no breaking of the system vacuum is required by the method 200 and variations thereof, operation downtime of the system is reduced. As indicated above, the in situ cleaning can be done between substrate processing, without causing a significant interruption in system operation. Additionally, scheduled periodic in situ cleaning, per these methods, can not only considerably prolong the average time between more extensive system maintenance, but can inhibit unplanned system shut down resulting from process instability or unacceptable processing conditions, e.g., due to drift. By vessel cleaning, at regular intervals, the ambiguity in determining best time for performing maintenance is reduced and possibly even removed, as the thickness of the deposited material can be controlled and maintained below a desired level.

Figure 3:
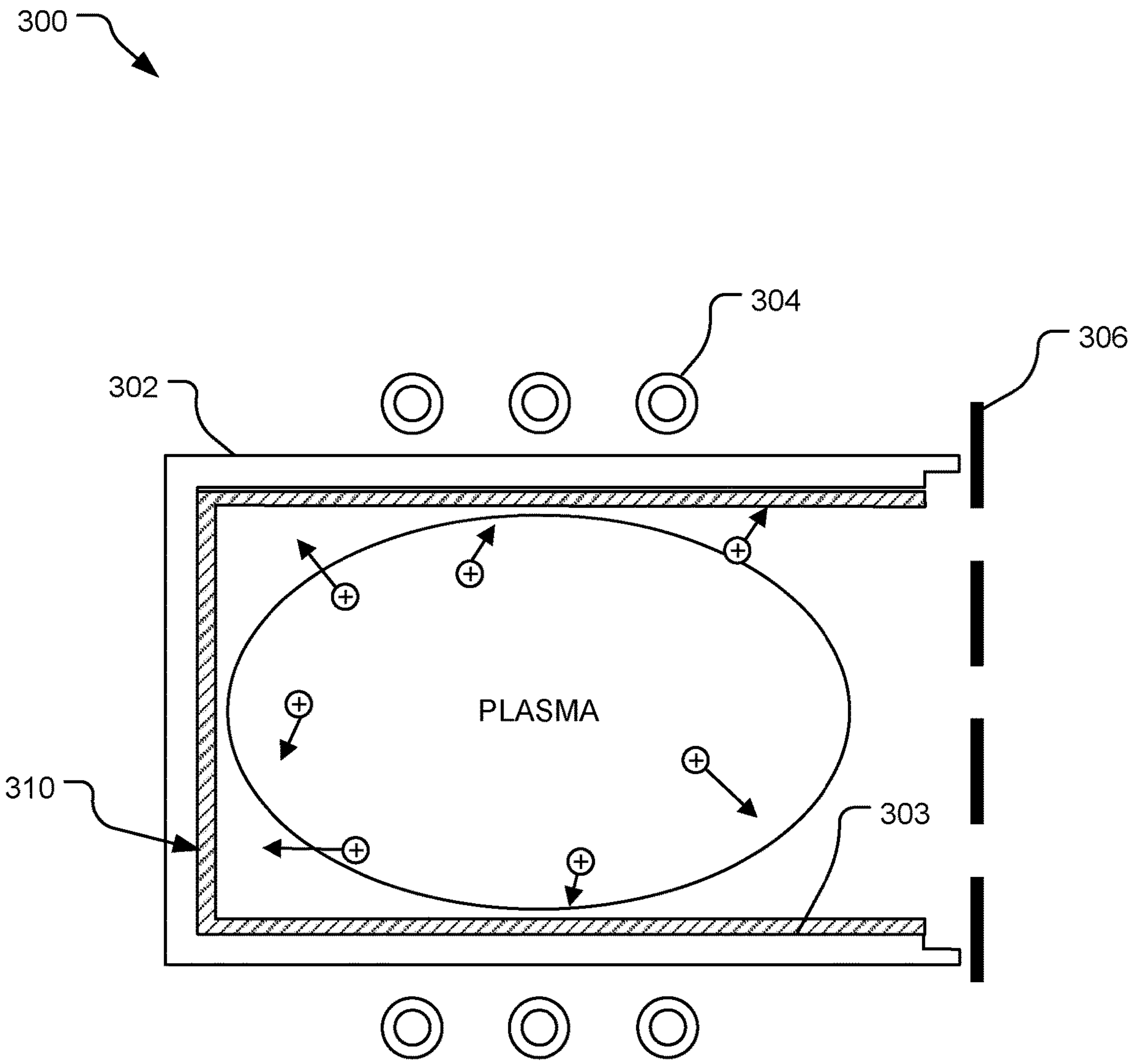
FIG. 3 is a schematic side view of a vessel illustrating cleaning by the methods described herein.

FIG. 3 shows pictorially and schematically an interior of an ion beam source 300 having a plasma vessel 302 and RF coils 304 that produce the plasma in the vessel 302 (the coils 304 also referred to as a plasma source herein). One grid 306 is shown, although other systems may have multiple grids. The interior wall 303 of the plasma vessel 302 has a thick coating 310 thereon, the coating 310 having been formed by back scattered material sputtered from the target and/or substrate being coated (the target and substrate not shown in FIG. 3).

In FIG. 3, the RF power to the plasma source has been increased (e.g., to at least 500 W, e.g., to 500 W-3000 W) so that ions from the plasma impinge on the coating 310 on the wall 303 of the plasma vessel 302, etching or removing the material 310.

As indicated, the particular operating parameters of the conditioning process are determined by the conditions and parameters of the ion beam system (e.g., deposition and/or etching) itself and the type and amount of material desired to be removed from the vessel wall. A skilled operator of the ion beam system would be able to determine the desired cleaning parameters for the particular deposited material based on the system parameters.

Vessel cleaning, per the processes described herein, provides numerous benefits. The cleaning prolongs the operational life of the vessel, and in an in situ manner, without the need to break the system vacuum. The operational stability of the system is improved by the cleaning, removing the material layer responsible for dissipating and reflecting RF electromagnetic waves. The improved stability leads to less process drift and less process variation, which result in less need to retune the process, allowing for more productive operation time and more consistent output from one product to the next.

The cleaning processes are applicable to any ion source system and are not system or material dependent.

The above specification and examples provide a complete description of the process and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. Features and elements from one implementation or embodiment may be readily applied to a different implementation or embodiment, unless contrary thereto. Furthermore, features from one implementation or embodiment may be combined with features from another implementation or embodiment to form yet another implementation or embodiment. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many embodiments and implementations of the invention can be made without departing from the spirit and scope of the invention, the invention resides in the claims hereinafter appended.

What is claimed:

1. A method of in-situ cleaning a plasma vessel of an ion beam source of an ion beam deposition system, the plasma vessel remote from a process chamber, the method comprising, via the ion beam deposition system:

maintaining a plasma in the plasma vessel at an initial low RF power and an initial low gas flow;

while maintaining the plasma, turning off any grid bias on any apertured grid of the ion beam deposition system; and after turning off any grid bias, increasing the RF power to the plasma to at least 500 W and providing a gas flow of 2-30 sccm.

2. The method of claim 1, wherein the initial low RF power is no more than about 500 W.

3. The method of claim 1, wherein the initial low gas flow is 10-60 sccm.

4. The method of claim 1, wherein increasing the RF power to the plasma comprises increasing the RF power to between 500 W and 3000 W for at least 30 seconds.

5. The method of claim 4, wherein increasing the RF power to the plasma comprises increasing the RF power for no more than 4 hours.

6. The method of claim 1, wherein the method is used between processing a first substrate and a second substrate and without breaking a vacuum of the ion beam system.

7. The method of claim 1 comprising transitioning the ion beam deposition system from an H-mode to an E-mode.

8. A method of in situ cleaning of a plasma vessel of an ion beam source of an ion beam deposition system, the plasma vessel remote from a process chamber, the method comprising:

transitioning the system from an H-mode to an E-mode;

increasing plasma potential after turning off any grid bias; and increasing RF power and impinging energized ions on an inner wall of the vessel.

9. The method of claim 8, wherein the step of transitioning from the H-mode to the E-mode comprises increasing RF power and decreasing gas flow.

10. The method of claim 9, wherein decreasing gas flow comprises decreasing gas flow to 2-30 sccm.

11. The method of claim 8, wherein increasing the RF power and impinging energized ions comprises increasing the RF power to at least 500 W.

12. The method of claim 11, wherein increasing the RF power comprises increasing the RF power to between 500 W and 3000 W.

13. The method of claim 8, wherein increasing the RF power and impinging ions comprises impinging ions for at least 30 seconds.

14. The method of claim 8, wherein the method is done between processing a first substrate and a second substrate and without breaking a vacuum of the ion beam system.

15. A method of in situ cleaning of a plasma vessel of an ion beam source of an ion beam deposition system, the plasma vessel remote from a process chamber, the method comprising impinging ions onto a metal coating on an inner wall of the vessel after a transition from an H-mode to an E-mode.

16. The method of claim 15, wherein in E-mode, ions sputter the inner wall of the vessel.

17. The method of claim 15 comprising increasing RF power of the system to at least 500 W with a gas flow of 2-30 sccm.

18. The method of claim 17 comprising increasing RF power of the system to between 500 W and 3000 W.

19. The method of claim 15, wherein the method is done without breaking the vacuum of the ion beam system.

* * * * *